(12) United States Patent
Rhee

(10) Patent No.: US 8,058,127 B2
(45) Date of Patent: Nov. 15, 2011

(54) MANUFACTURING METHOD OF SEMICONDUCTOR POWER DEVICES

(76) Inventor: Tae Pok Rhee, Suwon-si (KR)

( * ) Notice: Subject to any disclaimer, the term of this patent is extended or adjusted under 35 U.S.C. 154(b) by 132 days.

(21) Appl. No.: 12/664,688

(22) PCT Filed: Jun. 16, 2008

(86) PCT No.: PCT/KR2008/003390
§ 371 (c)(1),
(2), (4) Date: Dec. 15, 2009

(87) PCT Pub. No.: WO2008/153368
PCT Pub. Date: Dec. 18, 2008

(65) Prior Publication Data
US 2010/0184264 A1 Jul. 22, 2010

(30) Foreign Application Priority Data
Jun. 15, 2007 (KR) .................. 10-2007-0058974

(51) Int. Cl.
*H01L 21/336* (2006.01)
(52) U.S. Cl. ........ 438/270; 438/564; 438/589; 438/596; 257/E21.151; 257/E21.41; 257/E21.384
(58) Field of Classification Search .................. None
See application file for complete search history.

(56) References Cited

U.S. PATENT DOCUMENTS

| | | | |
|---|---|---|---|
| 6,031,265 A | 2/2000 | Hshieh | |
| 6,211,018 B1 | 4/2001 | Nam et al. | |
| 6,251,730 B1 | 6/2001 | Luo | |
| 6,498,071 B2 * | 12/2002 | Hijzen et al. | 438/425 |
| 6,534,367 B2 * | 3/2003 | Farr et al. | 438/270 |
| 6,753,228 B2 * | 6/2004 | Azam et al. | 438/270 |
| 6,855,601 B2 * | 2/2005 | Gajda | 438/259 |
| 7,015,125 B2 * | 3/2006 | Hshieh et al. | 438/589 |
| 7,049,677 B2 | 5/2006 | Fatemizadeh et al. | |
| 7,378,312 B2 * | 5/2008 | Kim | 438/243 |
| 7,667,264 B2 * | 2/2010 | Tai et al. | 257/330 |
| 7,777,273 B2 * | 8/2010 | Kim | 257/330 |
| 2005/0161764 A1 | 7/2005 | Fatemizadeh et al. | |

OTHER PUBLICATIONS

International Search Report for PCT/KR2008/003390 dated Oct. 29, 2008.

* cited by examiner

*Primary Examiner* — Zandra Smith
*Assistant Examiner* — Khanh Duong
(74) *Attorney, Agent, or Firm* — Christopher Paul Mitchell

(57) ABSTRACT

Disclosed is a power semiconductor device, in particular, a trench type power semiconductor device for use in power electronic devices. A method of manufacturing the same is provided. The method of manufacturing the power semiconductor device adopts a trench MOSFET to decrease the size of the device, in place of a vertical type DMOSFET, under a situation in which the cost must be lowered owing to excessive cost competition. As the manufacturing process is simplified and the characteristics are improved, the cost is reduced, resulting in mass production and the creation of profit.

5 Claims, 5 Drawing Sheets

[Fig. 1]
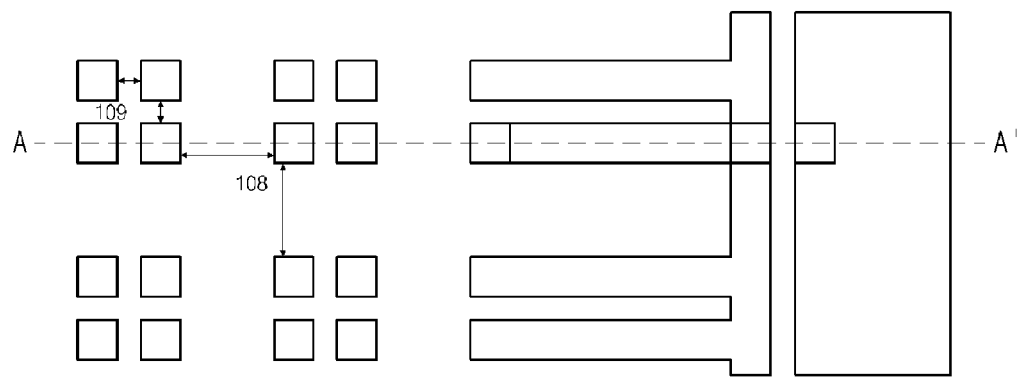
[Fig. 2]
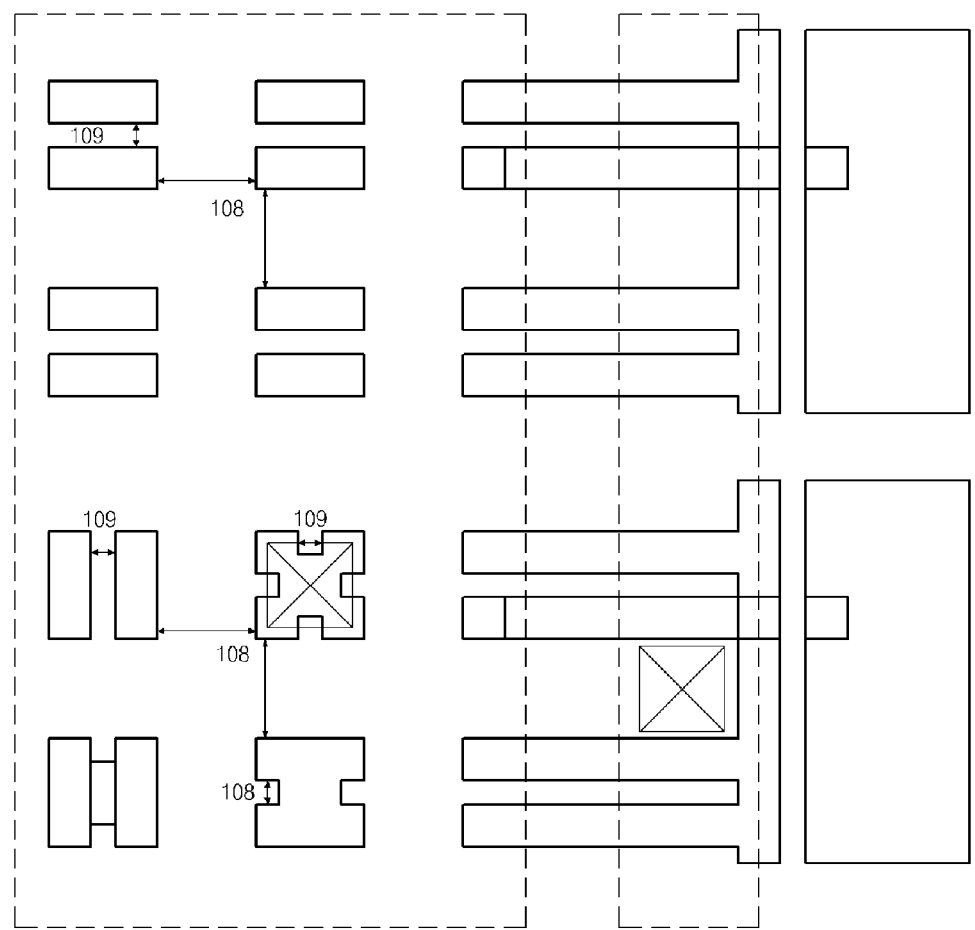

[Fig. 3]
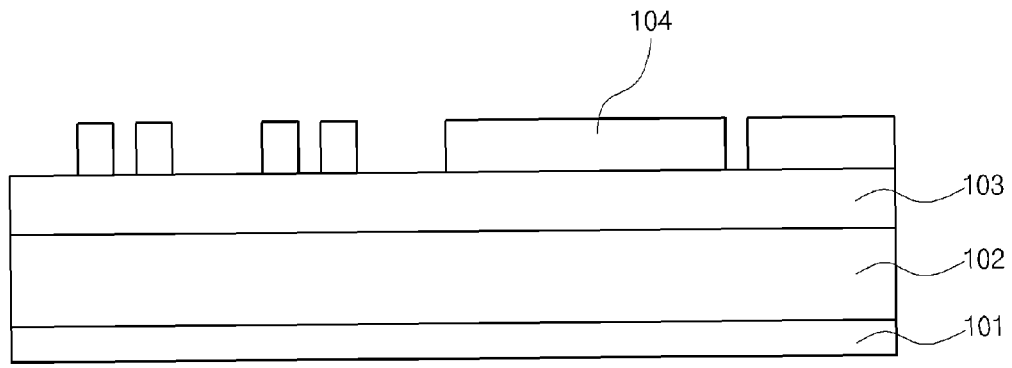
[Fig. 4]
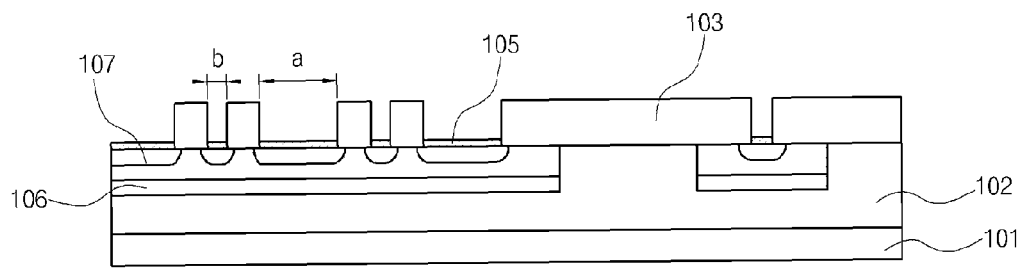
[Fig. 5]
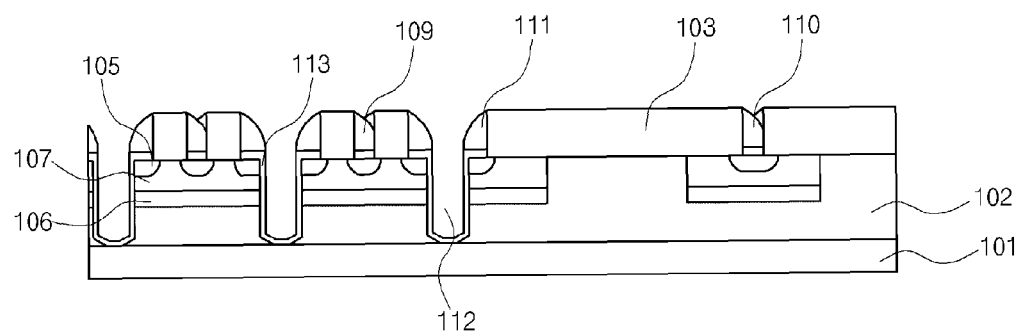
[Fig. 6]
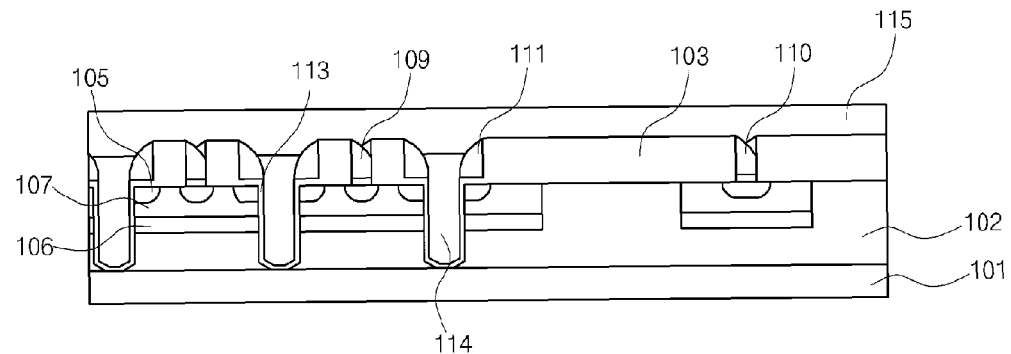

[Fig. 7]
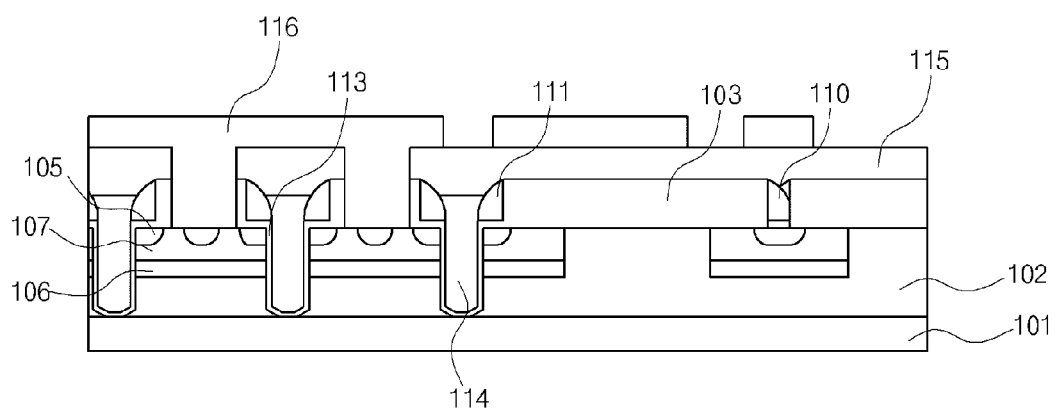
[Fig. 8]
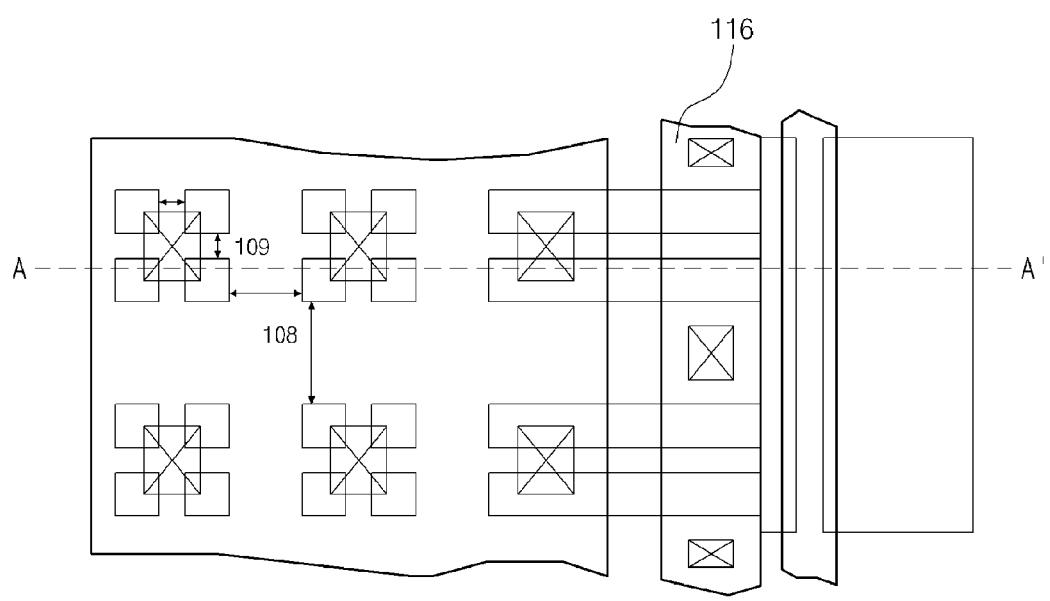

[Fig. 9]
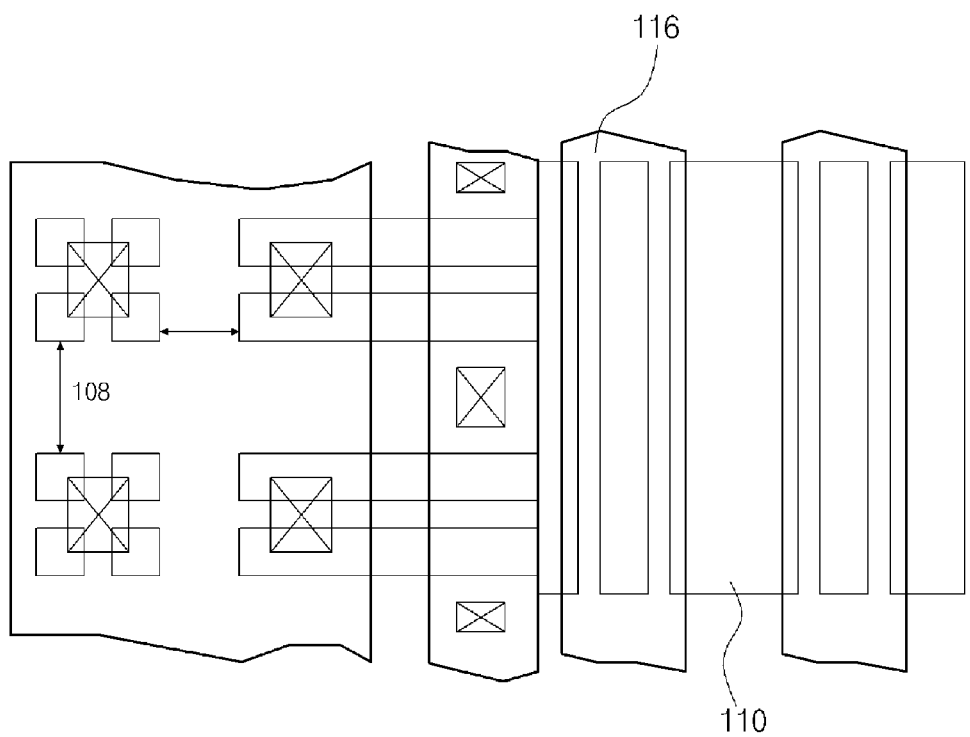
[Fig. 10]
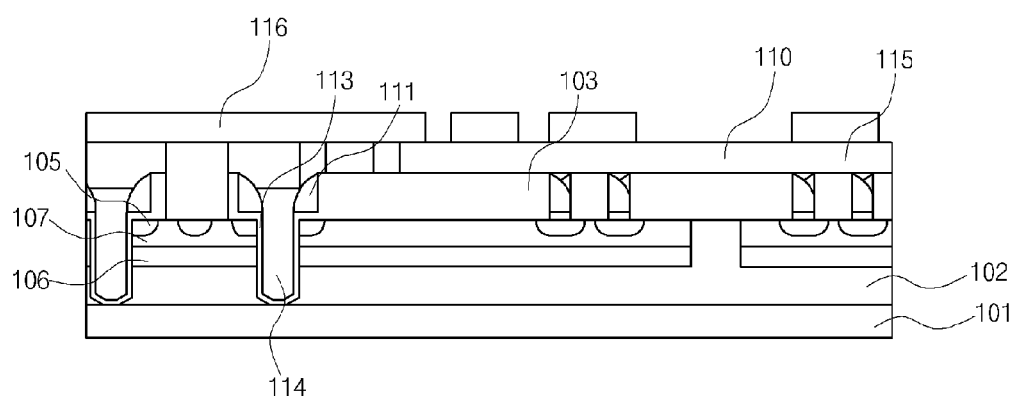

[Fig. 11]
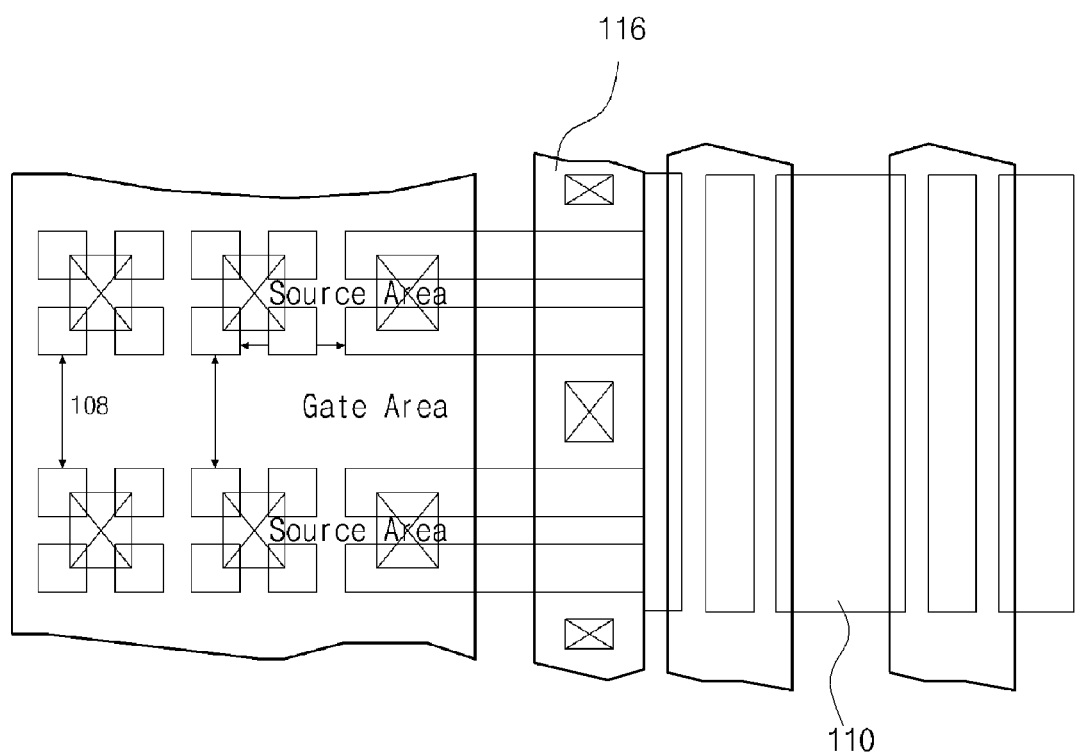

MANUFACTURING METHOD OF SEMICONDUCTOR POWER DEVICES

RELATED APPLICATIONS

This application is a 371 application of International Application No. PCT/KR2008/003390, filed Jun. 16, 2008, which in turn claims priority from Korean Patent Application No. 10-2007-0058974, filed Jun. 15, 2007, both of which are incorporated herein by reference in their entirety.

TECHNICAL FIELD

The present invention relates to a power semiconductor device, and more particularly, to a trench type power semiconductor device for use in power electronic devices and a method of manufacturing the same.

This application claims the benefit of Korean Patent Application No. 10-2007-58974, entitled Trench type power semiconductor device and a method of manufacturing the same which is hereby incorporated by reference in its entirety into this application of the present invention.

BACKGROUND ART

Generally, power semiconductor devices refer to semiconductors able to control power, and enable the conversion or control of power over a range from ones of watts to gigawatts. Well-known examples of power semiconductor devices include a rectifying diode, a bipolar transistor, a thyristor, a GTO, a diac, a triac, a power MOSFET, an IGBT, an IPM (Intelligent Power Module), etc.

Among the power semiconductor devices, particularly useful is a MOSFET (Metal Oxide Semiconductor Field Effect Transistor) in order to reduce the size of a device because a JFET region is minimized or eliminated, thereby further lowering on-resistance ($R_{on}$) than when using a planar power MOSFET.

A conventional method of manufacturing a trench type power semiconductor device includes sequentially forming a first conductivity type low-concentration epitaxial layer and a guard ring region on a first conductivity type high-concentration semiconductor substrate.

Then, a second conductivity type body region is formed thereon, and an oxide film pattern, which is provided on the body region, is formed into a gate trench pattern using an etching mask. The oxide film pattern is etched, and a trench hole is formed in the epitaxial layer.

Subsequently, a sacrificial oxide film is grown and then removed, after which a gate oxide film is formed and the trench is filled with polysilicon which is doped to a high concentration.

Subsequently, photolithography and etching for forming a gate electrode are conducted, thus forming the gate. Further, a second conductivity type high-concentration source is formed through photolithography and ion implantation, and diffusion heat treatment is performed to define a channel region of the second conductivity type.

Finally, a first conductivity type high-concentration source is formed through photolithography and ion implantation, and an insulator is then formed thereon. Further, a contact hole is formed in the upper portion of the gate electrode and source region, and then, a metal process is carried out, thus completing the manufacture of a product. Typically, photolithography is conducted seven times.

Although this manufacturing method is advantageous because a device can be effectively manufactured to be smaller than a general vertical type MOSFET, it suffers in that the manufacturing technique is difficult to realize. Further, as competitiveness is increased, there is an urgent requirement to develop a way to simplify the manufacturing process.

To this end, various attempts have been made to simplify the process. In fact, however, it is not easy to simplify the process without deteriorating the properties of the device.

DISCLOSURE OF INVENTION

Technical Problem

Accordingly, the present invention has been made keeping in mind the above problems occurring in the prior art, and the present invention provides a method of manufacturing a power semiconductor device, in which a trench type is applied to realize a high-density device, and a product is simply designed and the manufacturing process thereof is simplified, in order to ensure stable performance in the fabrication of multichannel driver ICs having good matching properties.

Technical Solution

According to the present invention, a method of manufacturing a trench type power semiconductor device may comprise growing a first type epitaxial layer 102 on a first type high-concentration silicon substrate 101 and growing an initial oxide film 103 at a thickness ranging from 5000 to 10000; applying a photoresist 104 on the initial oxide film (103) and performing photolithography and development, thus forming a trench pattern; etching the exposed area of the initial oxide film 103 using the trench pattern, removing the photoresist 104, forming a screen oxide film 105 for ion implantation on the exposed area of the epitaxial layer 102, and forming a second type body region 106 through ion implantation and a drive-in process; forming a first type high-concentration source region 107 through ion implantation; laminating a spacer oxide film and forming a spacer 111 through dry etching; subjecting a portion of the epitaxial layer 102 corresponding to a trench gate electrode, which is exposed upon formation of the spacer, to trench etching, thus forming a trench hole 112, cleaning the inside of the trench hole 112, growing a sacrificial oxide film (not shown), removing the sacrificial oxide film through wet etching, and then growing a gate oxide film 113; laminating polysilicon 114, which is doped to a high concentration to form the gate electrode, thus filling the trench hole 112, removing the doped polysilicon through polysilicon etch back or CMP (Chemical Mechanical Polishing) such that the initial oxide film is exposed, and forming an interlayer insulating film 115; laminating a photoresist for forming a contact pattern through second photolithography, and forming the pattern through the photolithography; etching the oxide film of each of the gate electrode and the source region, and forming a second type high-concentration source region; and conducting a process of applying a metal for a high-concentration source and a gate electrode, thus forming a metal electrode 116.

In the method of manufacturing the trench type power semiconductor device according to the present invention, upon ion implantation of the first type high-concentration source region 107, the open width of the gate region may be formed to be larger by at least a trench width than the open width of the source region; one guard ring 110 may be defined by two or more open regions, and two body regions are brought into contact with each other to constitute one guard ring 110; one guard ring 110 may include one or more body regions, and first, second or more guard rings 110 may be used alone or in combinations thereof.

The method of manufacturing the trench type power semiconductor device according to the present invention may further comprise forming a second conductivity type high-concentration region through ion implantation, after forming a contact hole.

Advantageous Effects

According to the present invention, in the method of manufacturing a power semiconductor device, a trench MOSFET is used in order to decrease the size of a device, in place of a vertical type DMOSFET, under a situation in which the manufacturing cost must be lowered owing to excessive cost competition. Further, as the process is simplified and the characteristics are improved, the manufacturing cost is reduced, resulting in mass production and the creation of profit.

In addition, in the case where a trench MOSFET or a trench IGBT useful as a power device is manufactured, the same voltage and on-resistance ($R_{on}$) can be realized on the smaller chip scale, compared to a conventional VDMOS, and also, the manufacturing process becomes simple.

Moreover, thanks to the simplicity of the process, a break-even point can be lowered for the manufacture of semiconductors, ultimately reducing initial investment costs. Even in the semiconductor manufacturing process using large amounts of toxic gases and chemicals, environmental protection can be realized.

BRIEF DESCRIPTION OF THE DRAWINGS

FIG. 1 is a top plan view shaving a trench pattern according to the present invention;

FIG. 2 is a view illustrating a layout according to the present invention;

FIGS. 3 to 7 are views sequentially showing the process of manufacturing the semiconductor device according to the present invention, on the basis of the cross-sectional view taken along the line A-A of FIG. 1;

FIG. 8 is a top plan view of FIG. 7;

FIGS. 9 and 10 are a top plan view and a cross-sectional view of a case where a guard ring of the present invention is used in a manner such that one or more ion implantation regions are overlapped, respectively; and FIG. 11 is a view shaving a case where a trench gate of the present invention is provided in the form of a strip.

DESCRIPTION OF THE REFERENCE NUMERALS IN THE DRAWINGS

102: epitaxial layer 103: initial oxide film
104: photoresist 105: screen oxide film
106: $2^{nd}$ type body region
107: $1^{st}$ type high-concentration source region
110: guard ring 111: spacer
112: trench hole 113: gate oxide film
114: polysilicon
115: interlayer insulating film
116: metal electrode

BEST MODE FOR CARRYING OUT THE INVENTION

The present invention pertains to a method of manufacturing a trench type power semiconductor device. Thus, the construction and effects of the present invention are described in detail with reference to the appended drawings.

As shown in FIG. 3, the method of manufacturing the power semiconductor device according to the present invention includes a first step composed of growing a first type epitaxial layer 102 on a first type high-concentration silicon substrate 101 and growing an initial oxide film 103 at a thickness of 5000~10000. Specifically, FIG. 3 is a cross-sectional view taken along the line A-A of FIG. 1, and illustrates the process of sequentially growing the epitaxial layer 102 and the initial oxide film 103 on the silicon substrate 101.

Next, the method of the present invention includes a second step composed of applying a photoresist 104 on the initial oxide film 103 and performing photolithography and development, thus forming a trench pattern. Specifically, as shown in FIG. 3, the photoresist 104 is applied on the initial oxide film 103, and the trench pattern is formed.

Next, the method of the present invention includes a third step composed of etching the exposed area of the initial oxide film 103 through the trench pattern, removing the photoresist 104, forming a screen oxide film 105 for ion implantation on the exposed area of the epitaxial layer 102, and forming a second type body region 106 through ion implantation and a drive-in process. Specifically, as shown in FIG. 4, the exposed area of the initial oxide film 103 is etched using the trench pattern, and the photoresist 104 is then removed. Thereafter, the screen oxide film 105 for ion implantation is formed on the exposed area of the epitaxial layer 102, and then the second type body region 106 is formed through ion implantation and a drive-in process.

Next, the method of the present invention includes a fourth step composed of forming a first type high-concentration source region 107 through ion implantation, and a fifth step composed of laminating a spacer oxide film and forming a spacer 111 through dry etching. Specifically, as shown in FIG. 4, the first type high-concentration source region 107 is formed through ion implantation. As such, the open width (a) of the gate region is formed to be larger by at least a trench width than the open width (b) of the source region. FIG. 2 illustrates the layout of a pattern required to overlap the high-concentration source region with a contact hole so as for effective metal contact in the course of performing the subsequent processes. As shown in FIG. 5, the spacer oxide film is laminated, and the spacer 111 is formed through dry etching. Upon the formation of the spacer 111, a portion of the epitaxial layer 102 corresponding to a trench gate electrode is exposed.

Next, the method of the present invention includes a sixth step composed of subjecting the portion of the epitaxial layer 102 corresponding to a trench gate electrode, which is exposed upon the formation of the spacer, to trench etching, thus forming a trench hole 112, cleaning the inside of the trench hole 112, gaming a sacrificial oxide film (not shown), removing the sacrificial oxide film through wet etching, and then gaming a gate oxide film 113. Specifically, as shown in FIG. 5, the exposed portion of the epitaxial layer 102 is subjected to trench etching, thus forming the trench hole 112, and the inside of the trench hole 112 is then cleaned, after which the sacrificial oxide film (not shown) is grown therein and is then removed through wet etching. Subsequently, the gate oxide film 113 is grown. The open portion 109 of the source region and the upper portion of the guard ring 110 are covered with an oxide film or an insulating film for forming the spacer 111. Consequently, the trench hole 112 is formed only in a region where the gate electrode is to be formed. That is, the trench hole is formed only in the open width (a), which is larger.

Next, the method of the present invention includes a seventh step composed of laminating polysilicon 114 which is doped to a high concentration to form the gate electrode, thus filling the trench hole 112 therewith, removing the doped polysilicon through polysilicon etch back or CMP (Chemical Mechanical Polishing) such that the initial oxide film is exposed, and then forming an interlayer insulating film 115. Specifically, as shown in FIG. 6, polysilicon 114, which is doped to a high concentration to form the gate electrode, is laminated, and thus the trench hole 112 is filled therewith, after which the doped polysilicon is removed through polysilicon etch back or CMP such that the initial oxide film is exposed. Subsequently, the interlayer insulating film 115 is formed. More specifically, the removal of polysilicon is stopped at the time that the level of polysilicon is appropriately located below the top of the initial oxide film 103 so that polysilicon is not applied over the top of the initial oxide film 103. As such, the reason why the removal of polysilicon is stopped at the time that the level of polysilicon is located below the top of the trench is that the number of photomasks used is decreased by one. If the removal is stopped at the time that polysilicon is located over the top of the trench hole, a short circuit may be caused by a metal connection after the contact between the gate region and the source region. In contrast, if the removal is stopped at the time that polysilicon is located too shallow in the trench, that is, is located to be layer than the first type high-concentration region, the operation of the device becomes problematic. Specifically, such problems include high threshold voltage, high on-resistance, or non-operation of the device.

Next, the method of the present invention includes an eighth step composed of laminating a photoresist for forming a contact pattern through second photolithography, and forming the pattern through the photolithography, and a ninth step composed of etching the oxide film of each of the gate electrode and the source region, and forming a second type high-concentration source region. As shown in FIG. 7, the photoresist is laminated to attain the contact pattern through second photolithography, after which the pattern is formed through the photolithography. The oxide film of each of the gate electrode and the source region is etched, and then the photoresist is removed. Thereafter, depending on the characteristics of contact resistance, the conductivity type source region having a high concentration is subjected to ion implantation. Then, annealing is conducted.

Next, the method of the present invention includes a tenth step composed of conducting a process of applying a metal for a high-concentration source and a gate electrode, thus forming a metal electrode 116. As shown in FIG. 7, the metal electrode 116 is formed through a process of applying a metal for a source and a gate electrode.

An embodiment of the present invention is described below.

In the case where a product such as an LCD driver IC is manufactured, the driver IC for a TFT monitor having 262,000 colors for mobile phones may be manufactured through an about 0.35 µm process, thus decreasing the manufacturing cost. As well, the size of a high-voltage device can be reduced into the size of a low-voltage device, without the need to establish semiconductor plants, thereby increasing the freedom of design available for miniaturization.

In particular, the method of the present invention exhibits superior effects even on the fabrication of multichannel driver ICs requiring a device having good matching properties. Further, the method of the present invention may be applied to other products composed of high voltage devices, such as peripheral parts of flash memory or the main devices of read/write flash DML.

In the case where a trench MOSFET or a trench IGBT is manufactured, the same voltage and on-resistance may be realized on a smaller chip scale, compared to conventional VDMOS, and furthermore, the manufacturing process may be simplified.

Compared to conventional manufacturing methods, the method of the present invention can realize a simple manufacturing process, thus lowering the break-even point in the manufacture of semiconductors, and drastically lowering initial investment costs. Also, even in the semiconductor process which uses large amounts of toxic gases and chemicals, environmental protection can be effected.

More particularly, when the first type high-concentration source region 107 is subjected to ion implantation, the open width of the gate region is formed to be larger by at least a trench width than the open width of the source region. The source region is defined between the neighboring gates, and designates the wide open region in FIGS. 3 and 4. In order to fill the narrow region, a medium should be laminated at a thickness corresponding to 50% of a minimum narrow width, or it may be applied to a higher thickness. However, the final trench region is determined by the kind of medium to be filled therein and dry etching of the medium. If the above conditions are not fulfilled, the trench region is not formed. The source region is provided in the form including opposite side surfaces of the region where the trench is to be formed, that is, the lower end of the spacer comes to be a high-concentration source region, and the body region is formed therebeneath.

In the present invention, one guard ring 110 is defined by two or more open regions, and two body regions are brought into contact with each other to constitute one guard ring 110. For high voltage devices or products, the number of guard rings should be adequately ensured, and an adequate distance therebetween is also required. The reason is due to a difference in breakdown voltage in a spherical junction, a cylindrical junction, and a planar junction. In the case of high voltage, the product is manufactured to be close to a planar junction.

The above-mentioned one guard ring 110 includes one or more body regions, and first, second or more guard rings 110 are used alone or in combinations thereof. For that reason, the number of second conductivity type high-concentration regions is not one but is increased to two or three, in order to increase breakdown voltage. When the guard rings of 107 are connected to realize diffusion contact of two regions, the distance therebetween is decreased.

In the present invention, after the formation of the contact hole, a second conductivity type high-concentration region is additionally formed through ion implantation. In the case of a p-type for ohmic contact, Al, which is a trivalent medium, is formed into a $P^+$ region, but in the case of the high-concentration source region 107 (i.e., the second conductivity type region) is an N-body region, contact resistance is increased not through ohmic contact but through Schottky contact, ultimately increasing on-resistance. In order to prevent this problem, there is a case requiring additional high-concentration ion implantation. This belongs to a typical process.

FIG. 8 shows a top plan view and a cross-sectional view of a case where the guard ring is used in a manner such that one or more ion implantation regions are overlapped, and FIG. 9 shays the trench gate in the form of a strip. In this case, a rectangular trench structure is illustrated.

The invention claimed is:

1. A method of manufacturing a power semiconductor device, comprising:

growing a first type epitaxial layer (102) on a first type high-concentration silicon substrate (101) and growing an initial oxide film (103) at a thickness ranging from 5000 to 10000;

applying a photoresist (104) on the initial oxide film (103) and performing photolithography and development, thus forming a trench pattern;

etching an exposed area of the initial oxide film (103) using the trench pattern, removing the photoresist (104), forming a screen oxide film (105) for ion implantation on an exposed area of the epitaxial layer (102), and forming a second type body region (106) through ion implantation and a drive-in process;

forming a first type high-concentration source region (107) through ion implantation;

laminating a spacer oxide film and forming a spacer (111) through dry etching;

subjecting a portion of the epitaxial layer (102) corresponding to a trench gate electrode, which is exposed upon formation of the spacer, to trench etching, thus forming a trench hole (112), cleaning an inside of the trench hole (112), growing a sacrificial oxide film (not shown), removing the sacrificial oxide film through wet etching, and then growing a gate oxide film (113);

laminating polysilicon (114), which is doped to a high concentration to form the gate electrode, thus filling the trench hole (112), removing the doped polysilicon through polysilicon etch back or CMP (Chemical Mechanical Polishing) such that the initial oxide film is exposed, and forming an interlayer insulating film (115);

laminating a photoresist for forming a contact pattern through second photolithography, and forming the pattern through the photolithography;

etching the oxide film of each of the gate electrode and the source region, and forming a second type high-concentration source region; and conducting a process of applying a metal for a high-concentration source and a gate electrode, thus forming a metal electrode (116).

2. The method according to claim 1, wherein, upon ion implantation of the first type high-concentration source region (107), an open width of the gate region is formed to be larger by at least a trench width than an open width of the source region.

3. The method according to claim 1, wherein one guard ring (110) is defined by two or more open regions, and two body regions are brought into contact with each other to constitute one guard ring (110).

4. The method according to claim 1, wherein one guard ring (110) includes one or more body regions, and first, second or more guard rings (110) are used alone or in combinations thereof.

5. The method according to claim 1, further comprising forming a second conductivity type high-concentration region through ion implantation, after forming a contact hole.

* * * * *